(12) United States Patent
Breynaert

(10) Patent No.: US 11,923,850 B2
(45) Date of Patent: Mar. 5, 2024

(54) PARASITIC PULSE CANCELATION CIRCUIT

(71) Applicant: INTEVA PRODUCTS, LLC, Troy, MI (US)

(72) Inventor: François Breynaert, Caen (FR)

(73) Assignee: INTEVA PRODUCTS, LLC, Troy, MI (US)

( * ) Notice: Subject to any disclaimer, the term of this patent is extended or adjusted under 35 U.S.C. 154(b) by 0 days.

(21) Appl. No.: 17/715,223

(22) Filed: Apr. 7, 2022

(65) Prior Publication Data
US 2022/0368331 A1 Nov. 17, 2022

(30) Foreign Application Priority Data

Apr. 9, 2021 (FR) ..................................... 21/03684

(51) Int. Cl.
*H03K 5/00* (2006.01)
*H02P 7/00* (2016.01)
(Continued)

(52) U.S. Cl.
CPC ............ *H03K 23/58* (2013.01); *H02P 7/0094* (2013.01); *H02P 7/18* (2013.01); *H02P 27/08* (2013.01); *H03K 5/1252* (2013.01)

(58) Field of Classification Search
CPC .... H03K 23/58; H03K 5/1252; H02P 7/0094; H02P 7/18; H02P 27/08
See application file for complete search history.

(56) References Cited

U.S. PATENT DOCUMENTS

| 7,122,982 B2 * | 10/2006 | Sasaya | H02P 7/0094 388/909 |
| 8,525,464 B2 * | 9/2013 | Tanaka | G01P 3/48 318/807 |

(Continued)

FOREIGN PATENT DOCUMENTS

| FR | 3076677 A1 | 7/2019 |
| FR | 3076678 A1 | 7/2019 |
| JP | 2007236032 A | 9/2007 |

OTHER PUBLICATIONS

Search Report Issued in French Application No. 21/03684; Application Filing Date Apr. 9, 2021; dated Dec. 2, 2021 (6 pages).

*Primary Examiner* — Tuan T Lam
(74) *Attorney, Agent, or Firm* — CANTOR COLBURN LLP

(57) ABSTRACT

A motor control system includes a DC motor and a ripple count circuit. The DC motor includes a rotor that rotates in response to a drive current. The rotation of the rotor generates a mechanical force that drives a component. The ripple count circuit includes an active filter circuit and a parasitic pulse cancellation circuit. The active filter circuit is configured to filter the drive current and to generate a pulsed signal. The parasitic pulse cancelation circuit is in signal communication with the ripple count circuit to receive the pulsed signal and generates a ripple count signal that excludes parasitic pulses included in the pulsed signal having a parasitic voltage level that exceeds a voltage level of a voltage threshold. The parasitic pulse cancelation circuit actively adjusts the voltage level of the voltage threshold based at least in part on a rotational direction of the rotor.

12 Claims, 7 Drawing Sheets

(51) Int. Cl.
  *H02P 7/18*     (2006.01)
  *H02P 27/08*    (2006.01)
  *H03K 5/1252*   (2006.01)
  *H03K 23/58*    (2006.01)

(56) References Cited

U.S. PATENT DOCUMENTS

| | | |
|---|---|---|
| 11,177,809 B2 | 11/2021 | Breynaert et al. |
| 2001/0019660 A1* | 9/2001 | Ohno .................. H02P 1/18 |
| | | 388/809 |
| 2009/0254300 A1* | 10/2009 | Schneider ............ H02P 7/0094 |
| | | 702/145 |
| 2014/0001815 A1* | 1/2014 | Tanaka ................. H02P 7/29 |
| | | 318/474 |
| 2019/0006970 A1* | 1/2019 | Sullivan .................. H02P 6/08 |
| 2020/0343842 A1 | 10/2020 | Breynaert et al. |
| 2022/0360206 A1* | 11/2022 | Breynaert ............ H02P 7/0094 |

\* cited by examiner

PARASITIC PULSE CANCELATION CIRCUIT

CROSS-REFERENCE TO RELATED APPLICATIONS

This application claims benefit to French Application No. 21/03684, filed Apr. 9, 2021, the disclosures of which are incorporated by reference herein in their entirety.

TECHNICAL FIELD

Exemplary embodiments of the present disclosure are related to direct current (DC) motors, and more particularly, to DC motors for operating electrically operated automotive components.

BACKGROUND

Automobile vehicles are increasingly equipped with electrically operated adjustable components. For example, vehicles typically include sliding roofs, window glass regulators, rear view mirrors, or seats driven by electric DC motors. Information indicating the rotor speed of the motor can be utilized to determine a position of the adjustable component. Conventional position measurement systems utilize a sensor in conjunction with a magnetic ring to determine the rotor speed of the motor. For example, a Hall Effect Sensor (HES) detects movements of a magnetic ring integrated with the rotor. The magnet ring generates a magnetic flux of varying strength towards the HES depending on the relative axial position of the magnetic ring and sensor. The magnetic flux induces a current, and variations in magnetic flux result in variations in the induced currents. Accordingly, the frequency of the current measured by the HES is indicative of the rotor speed of the DC motor.

Other positional measurement systems have attempted to utilize a speed-proportional signal in order to determine a position of an adjustment device of a motor vehicle. However, these attempts have required the implementation of highly expensive controllers such as Field Programmable Gate Arrays (FPGAs), for example, to execute the computations necessary to obtain the targeted ripple currents. In other attempts, the entire motor assembly has been structurally modified with the goal of generating a normalize ripple pattern that eliminates ripple errors (e.g., parasitic pulses) and signal noise. Modifying the motor assembly, however, has proven to be overly expensive and results in limitations to the motor's overall performance.

SUMMARY OF THE INVENTION

According to a non-limiting embodiment, a motor control system includes a DC motor and a ripple count circuit. The DC motor includes a rotor that rotates in response to a drive current. The rotation of the rotor generates a mechanical force that drives a component. The ripple count circuit includes an active filter circuit and a parasitic pulse cancellation circuit. The active filter circuit is configured to filter the drive current and to generate a pulsed signal. The parasitic pulse cancelation circuit is in signal communication with the ripple count circuit to receive the pulsed signal and generates a ripple count signal that excludes parasitic pulses included in the pulsed signal having a parasitic voltage level that exceeds a voltage level of a voltage threshold. The parasitic pulse cancelation circuit actively adjusts the voltage level of the voltage threshold based at least in part on a rotational direction of the rotor.

According to another non-limiting embodiment, a method of controlling a motor control system is provided. The method comprises generating a drive current using a supply voltage and delivering the drive current to a direct current (DC) motor, rotating a rotor of the motor in response to the drive current, and generating a mechanical force in response to rotating the rotor to drive a component. The method further comprises filtering the drive current using an active filter circuit and generating a pulsed signal based on the filtered drive current. The method further comprises delivering the pulsed signal to a parasitic pulse cancelation circuit and generating a ripple count signal that excludes parasitic pulses included in the pulsed signal that have a parasitic voltage level that exceeds a voltage level of a voltage threshold The above-described and other features and advantages of the present invention will be appreciated and understood by those skilled in the art from the following detailed description, drawings, and appended claims.

The above-described and other features and advantages of the present invention will be appreciated and understood by those skilled in the art from the following detailed description, drawings, and appended claims.

BRIEF DESCRIPTION OF THE DRAWINGS

Embodiments of the present invention will now be described, by way of example only, with reference to the accompanying drawings in which.

DETAILED DESCRIPTION

Figure 1:
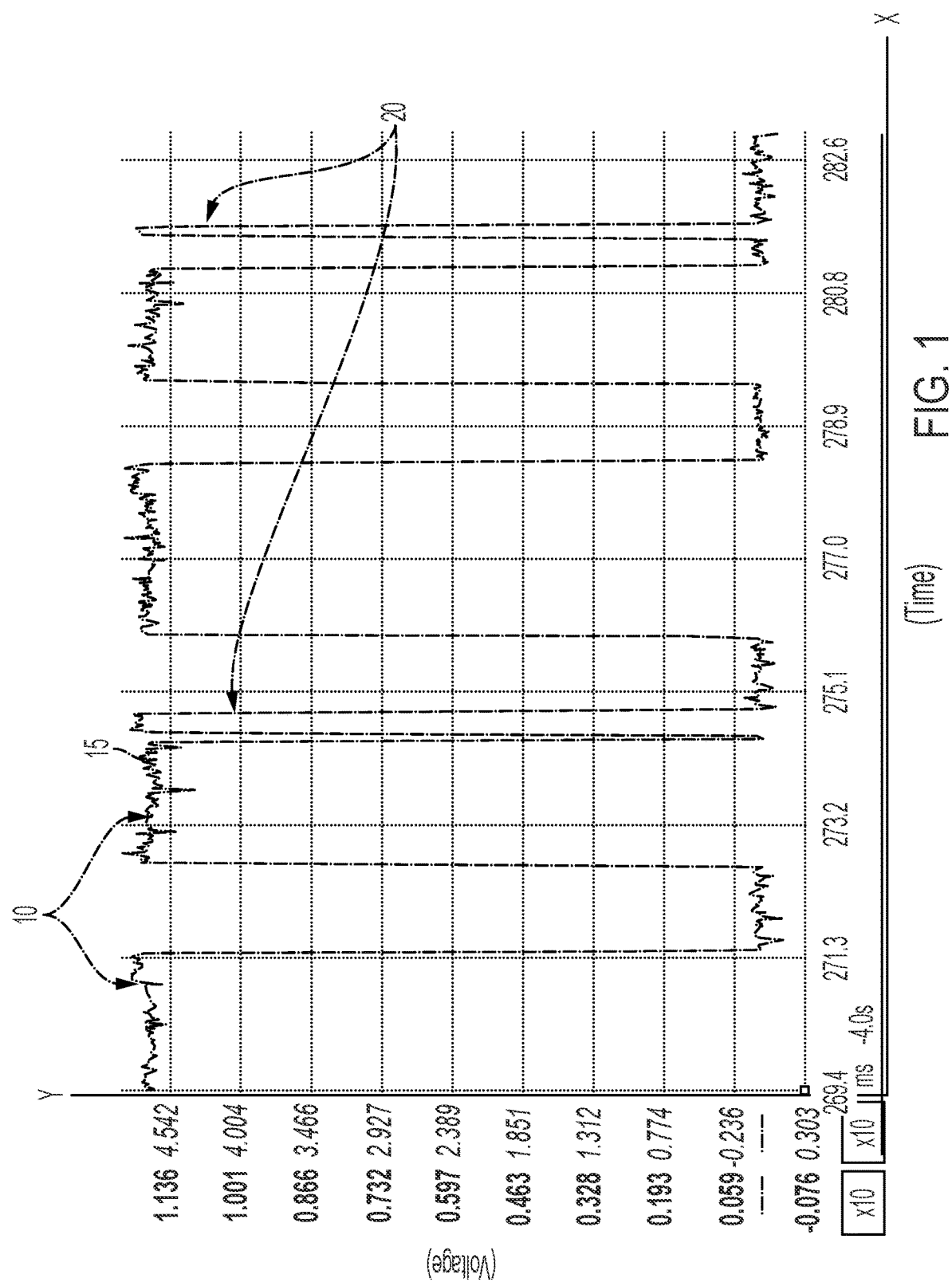
FIG. 1 is a signal diagram illustrating a parasitic pulse included in a ripple signal output from a conventional ripple count circuit.

Referring to FIG. 1, ripple signals 10 associated with electric DC motors are typically processed using either a software approach or a hardware approach. Both approaches, however, must account for parasitic pulses 20 (i.e., undesirable pulses) which can disturb the signal processing (e.g., ripple pulse counting) and cause inaccurate readings. In terms of the software approach, for example, a CPU (e.g., microcontroller) can sample the ripple signal, detect parasitic pulses, and process the ripple signal to remove the undesired parasitic pulses. However, the signal processing carried out by the CPU results in additional CPU processing time and increased power consumption.

Hardware approaches are known to implement an active filter circuit that implement an amplifier configured to filter noise from a pulsed signal while allowing the desired portions of the pulsed signal to pass. CPU processing power is conserved because CPU signal analysis and processing are not required to filter the signal. However, when a DC motor is under load and powered at low voltages, some parasitic pulses may have voltage levels that match or substantially match the voltage levels of the input signals applied to the amplifier. Consequently, the undesired parasitic pulses are allowed to pass through the bandpass filter and can appear in the output pulsed signal.

Various non-limiting embodiments described herein provide a hardware approach of eliminating parasitic pulses from appearing in a ripple count signal associated with a DC motor circuit. In one or more non-limiting embodiments, a motor control system is provided which includes an active filter circuit and a parasitic pulse cancellation circuit. The active filter circuit generates a pulsed signal in response to operating the DC motor. The pulses signal may include one or more undesirable parasitic pulses. The parasitic pulse cancelation circuit includes an output amplifier connected to the output of the active filter circuit. The output amplifier is configured to compare the pulsed signal output by an active filter parasitic voltage to a voltage threshold. Based on the rotational direction of the motor rotor, the parasitic pulse cancelation circuit actively adjusts the voltage level of the voltage threshold associated with the amplifier to ensure parasitic voltage levels of any parasitic pulses appearing in the pulsed signal are maintained above the voltage threshold. Accordingly, the amplifier can output a ripple count signal that excludes parasitic pulses that may occur in the pulsed signal generated by the active filter circuit.

Figure 2:
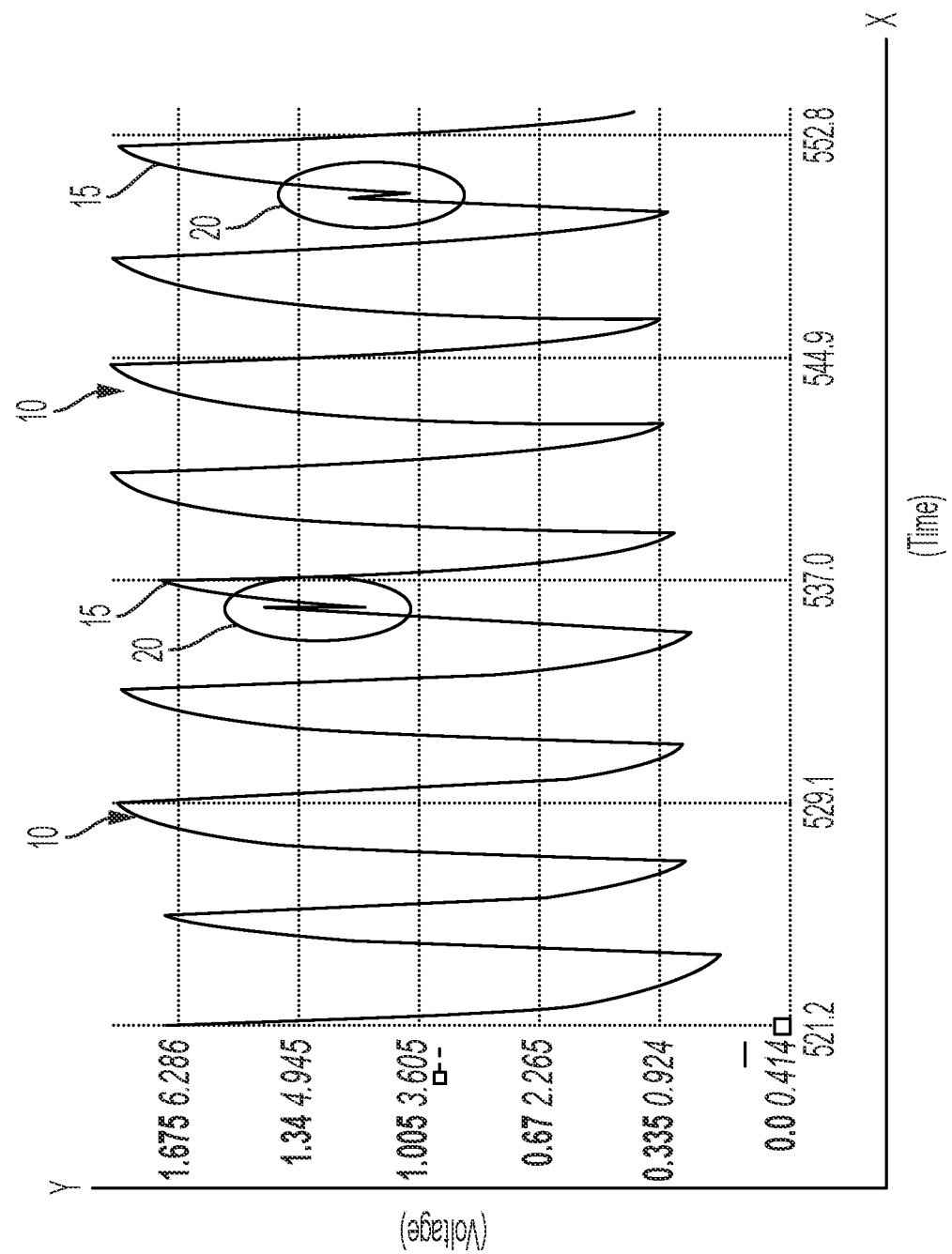
FIG. 2 is a signal diagram illustrating parasitic pulses occurring in a ripple signal in response to rotating a motor rotor in a first direction.
Figure 3:
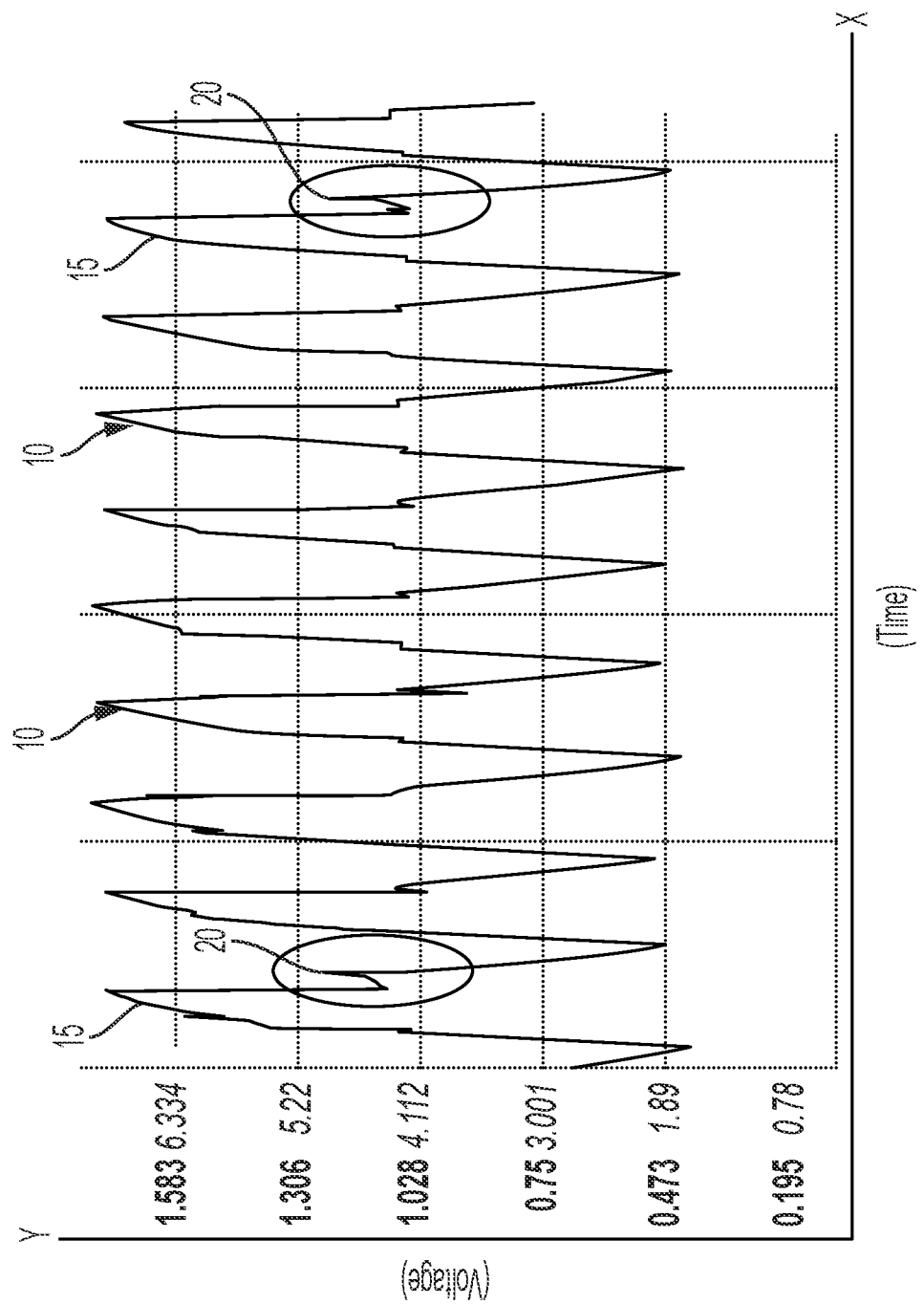
FIG. 3 is a signal diagram illustrating parasitic pulses occurring in a ripple signal in response to rotating a motor rotor in a second direction.
Figure 4A:
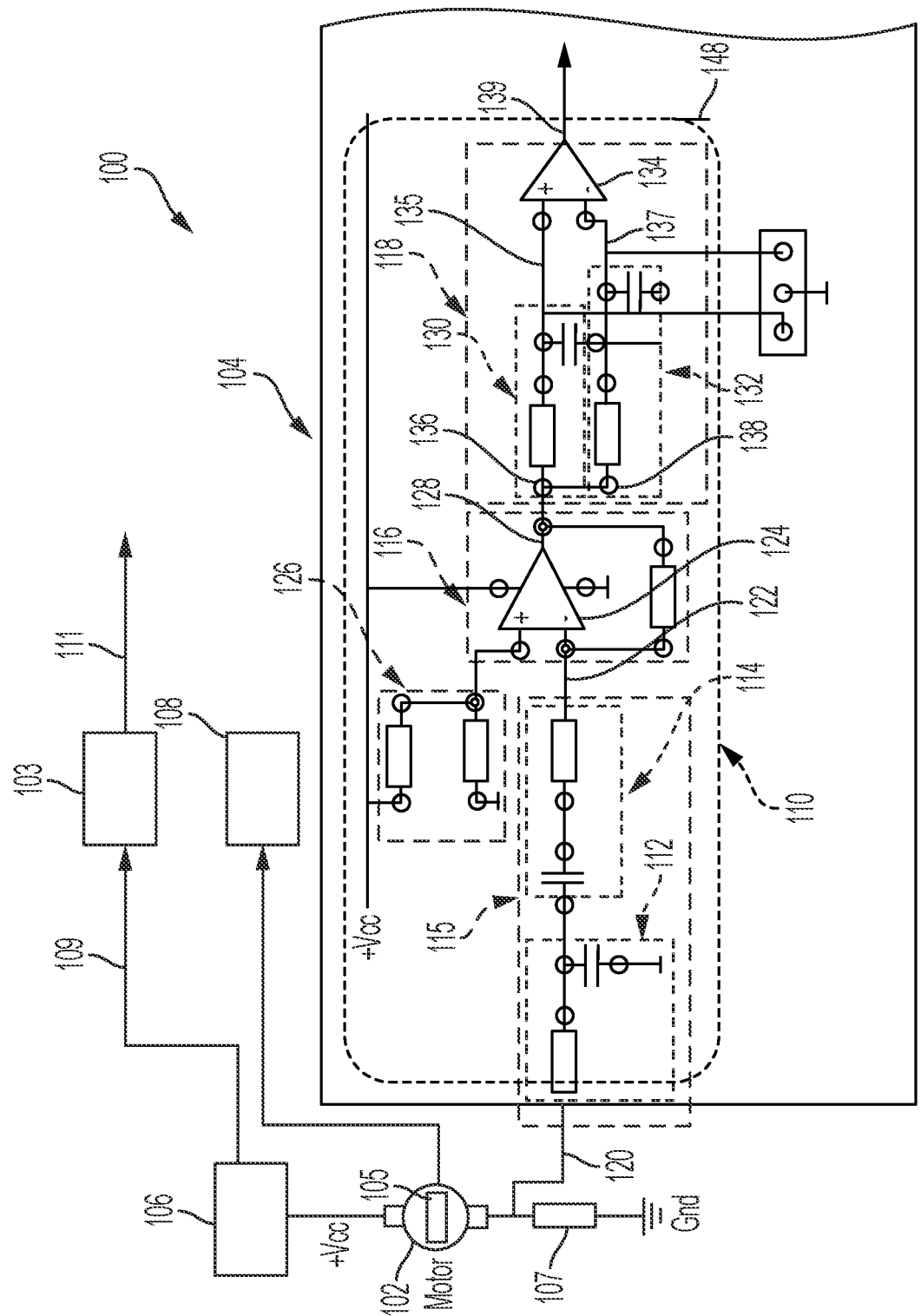
FIGS. 4A and 4B depict a schematic diagram of a motor control system including a ripple count circuit that employs a parasitic pulse cancellation circuit according to a non-limiting embodiment.
Figure 4B:
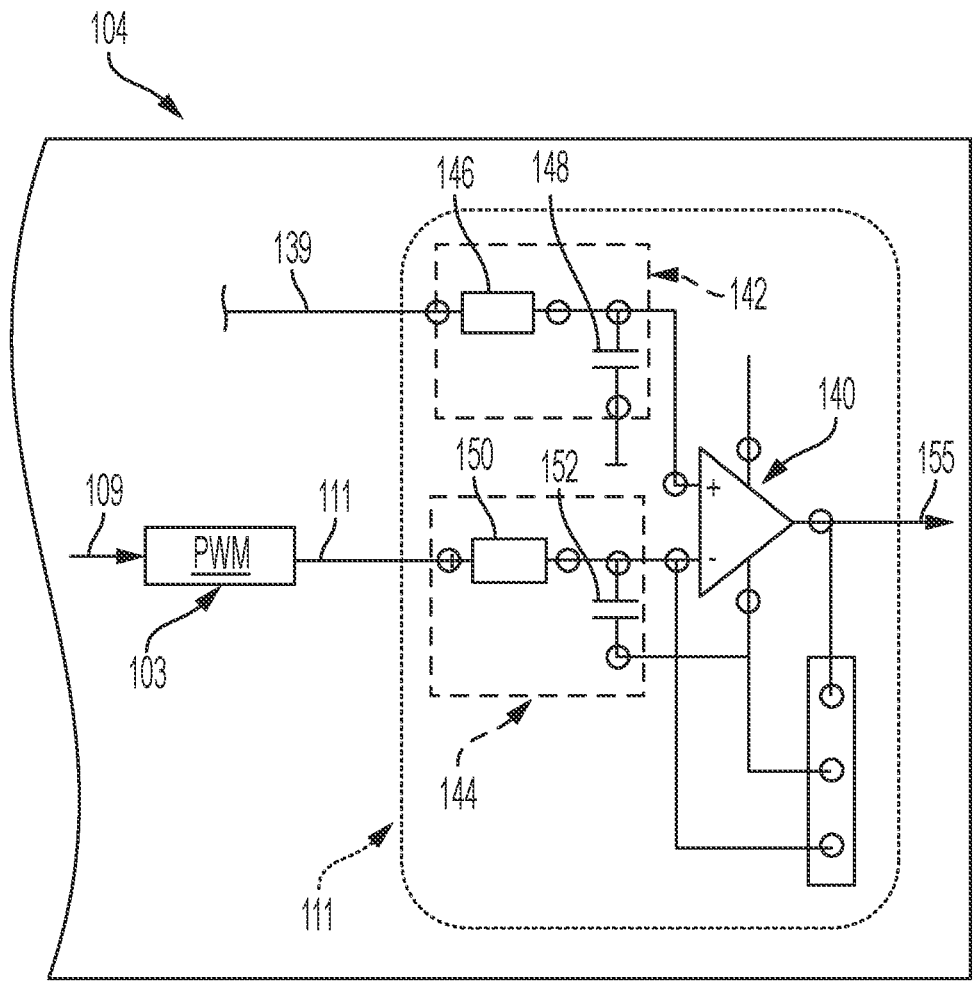

Referring to FIG. 1, ripple signals 10 associated with electric DC motors are typically processed using either a software approach or a hardware approach. However, the ripple signal 10 may include desirable pulses 15 to be utilized in analyze the operation of the DC motor and one or more undesirable parasitic pulses 20. The parasitic pulses 20 can disturb the signal processing (e.g., ripple pulse counting) and cause inaccurate readings associated with the operation of the DC motor. In some instances, the location of the parasitic pulses 20 can vary based on the rotational direction of the DC motor (e.g., the rotational direction of the motor rotor). Referring to FIG. 2, for example, parasitic pulses 20 can occur on the leading edge of a ripple signal 10 when the rotor rotates in a first direction (e.g., a clockwise direction). Referring to FIG. 3, however, parasitic pulses 20 can occur on the falling edge of a ripple signal 10 when the rotor rotates in a opposite second direction (e.g., a counter-clockwise direction).

The parasitic pulses 20 described above must be eliminated, or at the very least substantially reduced, when employing either the software approach or the hardware approach in order to improve the accuracy of the ripple count signal. In terms of the software approach, for example, a CPU (e.g., microcontroller) can sample the ripple signal, detect parasitic pulses, and process the ripple signal to remove the undesired parasitic pulses. However, the signal processing carried out by the CPU results in additional CPU processing time and increased power consumption. In addition, employing CPUs capable of effectively processing the ripple count signal to remove the parasitic pulses can prove to be expensive.

Hardware approaches are known to implement an amplifier that serves as an active bandpass filter for removing noise while allowing the input signal to pass. CPU processing power is conserved because CPU signal analysis and processing are not required to filter the signal. However, when a DC motor is under load and powered at low voltages, some parasitic pulses may have voltage levels that match or substantially match the voltage levels of the input signals applied to the amplifier. Consequently, the undesired parasitic pulses are allowed to pass through the bandpass filter and can appear in the output signal.

Various non-limiting embodiments described herein provide a hardware approach of eliminating parasitic pulses from appearing in a ripple count signal associated with a DC motor circuit. In one or more non-limiting embodiments, a motor control system is provided which includes an active filter circuit and a parasitic pulse cancellation circuit. The active filter circuit generates a pulsed signal in response to operating the DC motor. The pulses signal may include one or more undesirable parasitic pulses. The parasitic pulse cancelation circuit includes an amplifier configured to compare the pulsed signal output by an active filter parasitic voltage to a voltage threshold. Based on the rotational direction of the motor rotor, the parasitic pulse cancelation circuit actively adjusts the voltage level of the voltage threshold associated with the amplifier to ensure parasitic voltage levels of any parasitic pulses appearing in the pulsed signal are maintained above the voltage threshold. Accordingly, the amplifier can output a ripple count signal that excludes parasitic pulses that may occur in the pulsed signal generated by the active filter circuit.

With reference now to FIG. 2, a motor control system 100 is illustrated according to a non-limiting embodiment. The motor control system 100 includes a motor 102, a pulse width modulation circuit 103, and a ripple count circuit 104. The motor 102 includes a DC motor 102, which is in signal communication with a controller 106. The controller 106 can include, for example, an electronic hardware controller 106 which outputs a variable supply voltage (+Vcc) or controls the output of supply voltage generated by a power supply to the motor control system 100.

The DC motor 102 includes a rotor 105 induced to rotate in response to a drive current generated by the variable supply voltage (+Vcc). The rotation of the rotor 105 generates a mechanical force that drives a component 108. Going forward, the component 108 will be described in terms of an automotive vehicle window regulator unit 108. It should be appreciated, however, that other components 108 can be driven by the DC motor 102 including, but not limited to, a sliding roof, rear view mirrors, adjustable seats, etc. In terms of a window glass regulating unit 108, for example, the DC motor 102 can drive various mechanical components to vary the position of a glass window (e.g., move the window up or down). The input supply voltage (+Vcc) can be actively controlled to vary the voltage level applied to the DC motor 102, thereby adjusting the speed of the rotor 105, and thus the speed at which to move the glass window. A shunt resistor 107 can be connected to the output terminal of the motor 102 to measure AC or DC electrical drive current based on the voltage drop the drive current produces across the resistor 107.

The PWM circuit 103 is in signal communication with the controller 106 to receive a PWM control signal 109. The PWM circuit 103 generates a pulsed signal 111 (e.g., square wave) based on the PWM control signal 109. For example, the PWM control signal 109 can select a frequency and/or signal level at which to generate the PWM signal 111. A PWM controller (not shown) included the PWM circuit 103 receives the PWM control signal 109 and drives the PWM circuit to generate the PWM signal 111 having the selected a frequency and/or signal level set by the controller 106.

In one or more non-limiting embodiments, the controller 106 actively selects and varies or adjusts the signal characteristics (e.g., frequency, signal level, etc.) of the PWM signal 111 based on a rotational direction of the motor 102. For example, the controller 106 can deliver a first voltage having a first polarity to the motor 102 so as to rotate the rotor 105 in a first direction (e.g., a clockwise direction). Knowing the rotor 105 will be rotated in the first direction, the controller 106 outputs the PWM control signal 109 indicating a first frequency and/or first signal level at which to generate the PWM signal 111. When, however, the controller 106 delivers a second voltage having an opposite polarity to the motor 102 so as to rotate the rotor 105 in a second direction (e.g., a counter-clockwise direction), the controller 106 outputs the PWM control signal 109 indicating a second frequency and/or second signal level at which to generate the PWM signal 111. Accordingly, the signal characteristics of the PWM signal 111 can be actively varied and adjusted based on the rotational direction of the DC motor 102 (e.g., the rotor 105).

The ripple count circuit 104 includes an active filter circuit 110 and a parasitic pulse cancelation circuit 111. The active filter circuit 110 is configured to filter the drive current based on the rotational speed ($\omega$) of the rotor 105 and to generate a pulsed ripple output signal indicative of the rotational speed ($\omega$) of the rotor 105 and a rotational position ($\theta$) of the rotor 105. As described herein, the pulsed ripple signal output by the active filter circuit 110 includes a desirable pulse that can be utilized to analyze the operation of the motor 102, but may also include one or more undesirable parasitic pulses. The parasitic pulse cancelation circuit 111 is configured to eliminate the parasitic pulses from the ripple signal. Accordingly, the output ripple signal provided by the parasitic pulse cancelation circuit 111 has an improved accuracy compared to the ripple signal generated by conventional ripple count circuits.

The active filter circuit 110 includes a bandpass filter circuit 115, an amplifier circuit 116, and a comparator circuit 118. The bandpass filter circuit 115 includes a low-pass filter stage 112 and a high-pass filter stage 114 connected in series with the low-pass filter stage 112. An input 120 of the low-pass filter stage 112 is connected in common with the output terminal of the motor 102 and the input terminal of the shunt resistor 107 to receive an input drive current.

The amplifier circuit 116 includes a first amplifier 124 in signal communication with the high-pass filter stage 114. The first amplifier 124 can include, for example, an operational amplifier (typically referred to as an "op amp") having an inverting input (−) and a non-inverting input (+). The inverting input (−) is connected to the output 122 of the high-pass filter stage 114, while the non-inverting input (+) is connected to an offset circuit 126. Accordingly, the amplifier circuit 116 receives the filtered input drive current and generates an amplified drive current signal.

The comparator circuit 118 is in signal communication with the output 128 of the amplifier circuit 116 to receive the amplified drive current signal. The comparator circuit 118 includes a first input low-pass filter 130, a second input low-pass filter 132 and a second amplifier 134. The second amplifier 134 includes, for example, an op amp that can operate as a differential amplifier having a non-inverting input (+) and an inverting input (−). For example, the comparator circuit 118 can compare the amplified drive current signal output from the amplifier circuit 116 to a reference voltage potential. Accordingly, the comparator circuit 118 can generate a pulsed signal having a first output voltage level when a voltage level of the amplified drive current signal is greater than or equal to the reference voltage potential, and a second output voltage level when a voltage level of the amplified drive current signal is less than the reference voltage potential. In this manner, the pulsed signal generated at the output 139 of the comparator circuit 118 can indicate an actual rotational speed ($\omega$) and an actual rotational position ($\theta$) of the rotor 105.

The inputs of the first and second input low-pass filters 130 and 132, respectively, are connected to the output 128 of the amplifier circuit 116. The output 135 of the first input low-pass filter 130 is connected directly to the non-inverting input (+) of the second amplifier 134, while the output 137 of the second input low-pass filter 132 is connected directly to the inverting input (−) of the second amplifier 134. The first and second input low-pass filters 130 and 132 are configured to filter the amplified drive current signal and minimize the parasitic noise delivered to the second amplifier 134.

The parasitic pulse cancelation circuit 111 is in signal communication with the active filter circuit 110 (e.g., output 139 of comparator circuit 118) to receive the pulsed signal. The parasitic pulse cancelation circuit 111 includes a second amplifier 140, an inverting input filter 142, and a non-inverting input filter 144. The second amplifier 140 can include an op amp having a non-inverting input (+) and an inverting input (−). The non-inverting input filter 142 and the inverting input filter 144 can each be constructed as low-pass RC filters. For example, the non-inverting input filter 142 can include a first resistor 146 and a first capacitor 148.

The input of the non-inverting input filter 142 (e.g., a first terminal of the first resistor 146) is connected directly to the output 139 of the active filter circuit 110, while the output of the non-inverting input filter 142 (e.g., the opposing second terminal of the first resistor 146) capacitor is connected directly to the non-inverting input (+) of the second amplifier 140. Accordingly, the pulsed signal generated at the output 139 of comparator circuit 118 is filter by the non-inverting input filter 142 and a filter pulsed signal is delivered to the non-inverting input (+) of the second amplifier 140.

The input of the inverting input filter 144 (e.g., a first terminal of the second resistor 150) is connected directly to the output of the PWM circuit 103, while the output of the inverting input filter 144 (e.g., the opposing second terminal of the second resistor 150) is connected directly to the inverting input (−) of the second amplifier 140. Accordingly, the PWM signal 111 is filtered by the inverting input filter 144 and a filtered PWM signal is delivered to the inverting input (−) of the second amplifier 140. The signal characteristics of the PWM signal 111 set the voltage threshold of the second amplifier 140. In this manner, the second amplifier 140 can compare the signal characteristics (e.g., voltage level) of the filtered pulsed signal to the voltage threshold and output a ripple count signal 155 based on the comparison. For example, the second amplifier 140 can output a ripple count signal 155 having a logic "1" state in response to the voltage level of the filtered pulsed signal exceeding the voltage threshold and a logic "0" state in response to the voltage level of the filtered pulsed signal being less than or equal to the voltage threshold.

As described herein, the characteristics of the PWM signal 111 can be actively varied or adjusted according to the PWM control signal 109, which is ultimately generated based on the rotation of the motor 102 (e.g., the rotational direction of the rotor 105). By adjusting the characteristics of the PWM signal 111, the voltage threshold of the second amplifier 140 can be set such that the voltage level of the parasitic pulse entirely exceeds the voltage threshold when driving the motor rotor 105 in either the clockwise direction or the counter-clockwise direction.

For example, the PWM signal 111 can be generated at a first frequency to set the voltage threshold of the second amplifier 140 to a first voltage level (Vt1) in response to rotating the motor rotor 105 in a clockwise direction. When rotating the motor rotor 105 in the counter-clockwise direction, the PWM signal 111 can be generated at a second frequency that is lower than the first frequency which in turn sets voltage threshold of the second amplifier 140 to a second voltage level (Vt2) that is less than the first voltage level (Vt1). Thus, the voltage threshold of the second amplifier 104 can be actively lowered when driving the motor rotor 105 in the counter-clockwise direction compared to when driving the motor rotor 105 in the clockwise direction. The active adjustment of the voltage threshold manages to take into account the changing locations of the parasitic pulses (e.g., either in the rising edge or falling edge) when changing the rotational direction of the motor rotor 105.

Figure 5:
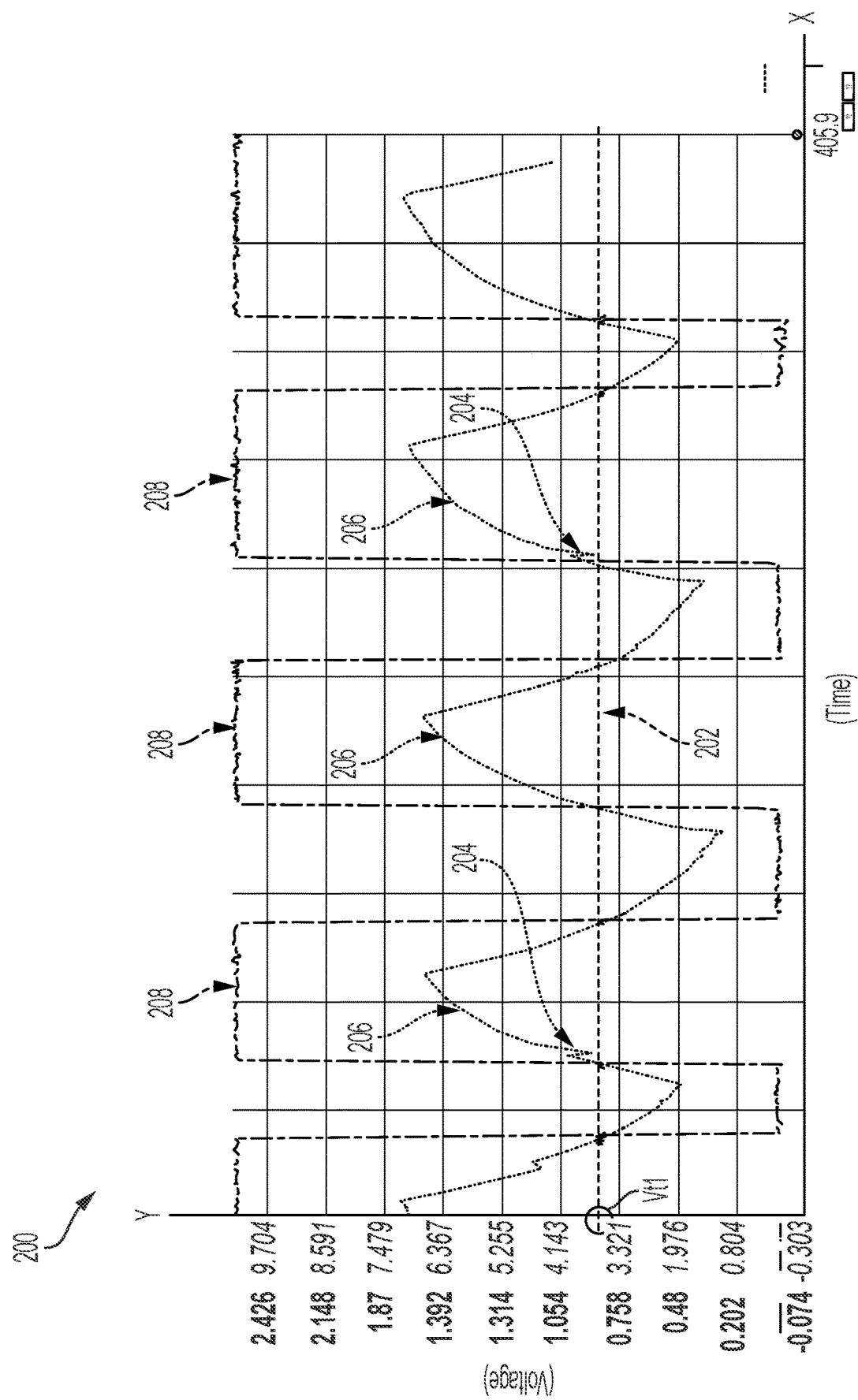
FIG. 5 is a signal diagram associated with the parasitic pulse cancellation circuit shown in FIGS. 4A and 4B in response to rotating a motor rotor in a first direction according to a non-limiting embodiment.
Figure 6:
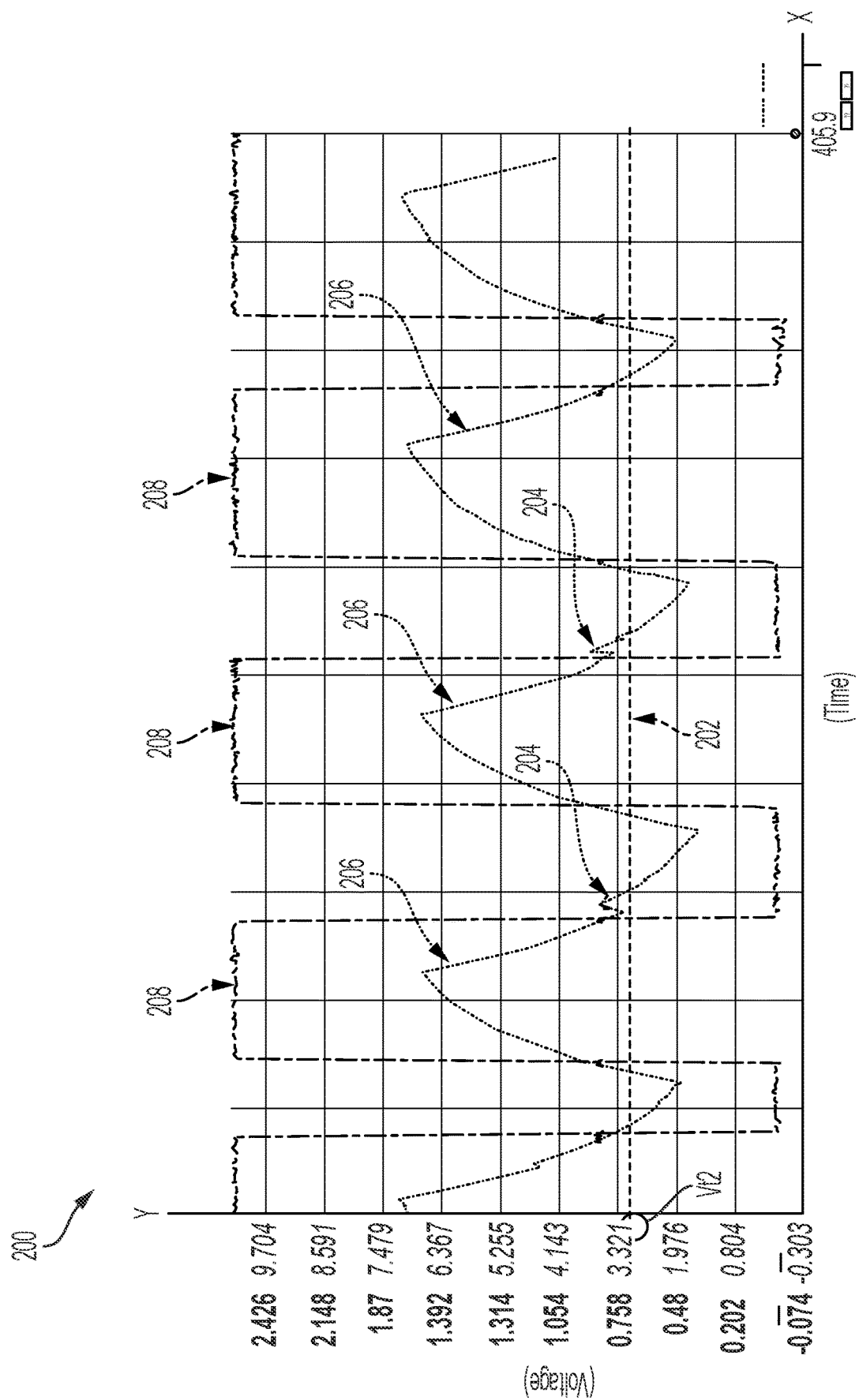
FIG. 6 is a signal diagram associated with the parasitic pulse cancellation circuit shown in FIGS. 4A and 4B in response to rotating a motor rotor in a second direction according to a non-limiting embodiment.

Examples of actively setting the voltage threshold of the second amplifier 140 based on the rotation of the motor 103 are illustrated in the signal diagrams 200 shown in FIGS. 5 and 6. Referring to FIG. 5, for example, the voltage threshold 202 of the second amplifier 140 can be set to a first voltage level (Vt1) in response to driving the motor rotor 105 in a clockwise direction. Accordingly, the parasitic pulses 204 appearing in the leading edges of the pulsed signal 206 repeatedly exceed the first voltage threshold without crossing below the voltage threshold 202. As a result, the second amplifier 140 continuously outputs a ripple count signal 208 without generating parasitic pulses 204 that appear in the pulsed signal 206.

Turning to FIG. 6, the voltage threshold 202 is shown set to a second voltage level (Vt2) when driving the motor rotor 105 in the counter-clockwise direction. The second voltage level (Vt2) is lower than the first voltage level (Vt1) implemented when driving the rotor motor 105 in the clockwise direction (see FIG. 5). Accordingly, the parasitic pulses 204 appearing in the falling edges of the pulsed signal 206 repeatedly exceed the voltage threshold 202 so as to avoid crossing the voltage threshold had it been maintained at the first voltage level (Vt1). In this manner, the second amplifier 140 outputs a ripple count signal 208 that excludes parasitic pulses 204 occurring in the pulsed signal 206 appearing in the output 139 of the active filter circuit 110.

As described herein, various non-limiting embodiments described herein provide a hardware approach of eliminating parasitic pulses from appearing in a ripple count signal associated with a DC motor circuit. In one or more non-limiting embodiments, a motor control system is provided which includes an active filter circuit and a parasitic pulse cancellation circuit. The active filter circuit generates a pulsed signal in response to operating the DC motor. The pulsed signal may include one or more undesirable parasitic pulses. The parasitic pulse cancelation circuit includes an amplifier configured to compare the pulsed signal output by an active filter parasitic voltage to a voltage threshold. The parasitic pulse cancelation circuit receives PWM signal having a frequency that varies in response to the rotational direction of the motor roto. The parasitic pulse cancelation circuit actively adjusts the voltage level of the voltage threshold associated with the amplifier based at least in part on the PWM signal to ensure parasitic voltage levels of any parasitic pulses appearing in the pulsed signal are maintained above the voltage threshold. Accordingly, the amplifier can output a ripple count signal that excludes parasitic pulses that may occur in the pulsed signal generated by the active filter circuit.

As used herein, the term "module" refers to an application specific integrated circuit (ASIC), a hardware controller, electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

As used herein, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. In addition, it is noted that the terms "bottom" and "top" are used herein, unless otherwise noted, merely for convenience of description, and are not limited to any one position or spatial orientation.

The modifier "about" used in connection with a quantity is inclusive of the stated value and has the meaning dictated by the context (e.g., includes the degree of error associated with measurement of the particular quantity).

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A motor control system comprising:
  a direct current (DC) motor including a rotor induced to rotate in response to a drive current generated by a supply voltage, the rotation of the rotor generating a mechanical force that drives a component;
  a ripple count circuit including an active filter circuit and a parasitic pulse cancellation circuit; and
  a pulse width modulation, "PWM" circuit in signal communication with the parasitic pulse cancelation circuit, the PWM circuit configured to generate a PWM signal based on the rotational direction of the rotor,
  wherein the active filter circuit is configured to filter the drive current and to generate a pulsed signal,
  wherein the parasitic pulse cancelation circuit is in signal communication with the ripple count circuit to receive the pulsed signal and generates a ripple count signal that excludes parasitic pulses included in the pulsed signal having a parasitic voltage level that exceeds a voltage level of a voltage threshold,
wherein the parasitic pulse cancelation circuit actively adjusts the voltage level of the voltage threshold based at least in part on a rotational direction of the rotor, and
wherein the parasitic pulse cancelation circuit actively adjusts the voltage level of the voltage threshold based at least in part on the PWM signal.

2. The motor control system of claim 1, wherein the parasitic pulses have a first parasitic voltage in response to rotating the rotor in a first direction and have a second parasitic voltage different than the first parasitic voltage in response to rotating the rotor in a second direction opposite the first direction.

3. The motor control system of claim 2, wherein the voltage threshold is set to a first voltage level (Vt1) that is less than the first parasitic voltage in response to rotating the rotor in a clockwise direction, and wherein the voltage threshold is set to a second voltage level (Vt2) that is less than the second parasitic voltage in response to rotating the rotor in a counter-clockwise direction.

4. The motor control system of claim 1, wherein the PWM signal is generated having a first frequency in response to rotating the rotor in the clockwise direction so as to set the first voltage level (Vt1) of the voltage threshold, and wherein the PWM signal is generated having a second frequency less than the first frequency in response to rotating the rotor in the counter-clockwise direction so as to set the second voltage level (Vt2) of the voltage threshold.

5. The motor control system of claim 1, wherein the parasitic pulse cancelation circuit further comprises an operational amplifier, "op amp" that compares the parasitic voltage of the parasitic pulses to the voltage threshold, outputs the ripple count signal having a logic "1" state in response to the parasitic voltage exceeding the voltage threshold, and outputs the ripple count signal having a logic "0" state in response to the parasitic voltage being less than or equal to the voltage threshold.

6. The motor control system of claim 5, wherein the op amp comprises:
a non-inverting input (+) configured to receive the pulsed signal; and
an inverting input (−) configured to receive the PWM signal,
wherein varying the frequency of the PWM signal actively adjusts the voltage level of the voltage threshold.

7. A method of controlling a motor control system, the method comprising:
generating a drive current using a supply voltage and delivering the drive current to a direct current (DC) motor;
rotating a rotor of the motor in response to the drive current;
generating a mechanical force in response to rotating the rotor to drive a component;
filtering the drive current using an active filter circuit and generating a pulsed signal based on the filtered drive current;
generating a pulse width modulation, (PWM) control signal indicative of a rotational direction of the rotor, and delivering the PWM signal to a PWM circuit included in a parasitic pulse cancelation circuit;
generating a PWM signal using the PWM circuit, wherein the PWM signal is generated based at least in part on the rotational direction of the rotor;
comparing, by the parasitic pulse cancelation circuit, a parasitic voltage level of the pulsed signal to a voltage level of a voltage threshold;
actively adjusting the voltage level of the voltage threshold using the parasitic pulse cancelation circuit based at least in part on the PWM signal; and
delivering the pulsed signal to the parasitic pulse cancelation circuit and generating a ripple count signal that excludes parasitic pulses included in the pulsed signal that have the parasitic voltage level that exceeds the voltage level of the voltage threshold.

8. The method of claim 7, wherein the parasitic pulses have a first parasitic voltage in response to rotating the rotor in a first direction and have a second parasitic voltage different than the first parasitic voltage in response to rotating the rotor in a second direction opposite the first direction.

9. The method of claim 8, further comprising setting the voltage threshold to a first voltage level (Vt1) that is less than the first parasitic voltage in response to rotating the rotor in a clockwise direction, and setting the voltage threshold is a second voltage level (Vt2) that is less than the second parasitic voltage in response to rotating the rotor in a counter-clockwise direction.

10. The method of claim 7, further comprising:
generating the PWM signal having a first frequency in response to rotating the rotor in the clockwise direction so as to set the first voltage level (Vt1) of the voltage threshold; and
generating the PWM signal having a second frequency that is less than the first frequency in response to rotating the rotor in the counter-clockwise direction so as to set the second voltage level (Vt2) of the voltage threshold.

11. The method of claim 7, further comprising:
comparing, using an operational amplifier, "op amp" set with the voltage threshold, the parasitic voltage of the parasitic pulses included in the pulsed signal to the voltage threshold;
outputting from the op amp the ripple count signal having a logic "1" state in response to the parasitic voltage exceeding the voltage threshold; and
outputting from the op amp the ripple count signal having a logic "0" state in response to the parasitic voltage being less than or equal to the voltage threshold.

12. The method of claim 11, further comprising:
delivering the pulsed signal to a non-inverting input (+) of the op amp;
delivering the PWM signal to an inverting input (−) of the op amp; and
actively adjusting the voltage threshold of the op amp in response to varying the frequency of the PWM signal.

* * * * *